United States Patent [19]
Bischel et al.

[11] Patent Number: 5,513,196
[45] Date of Patent: Apr. 30, 1996

[54] OPTICAL SOURCE WITH MODE RESHAPING

[75] Inventors: William K. Bischel, Menlo Park; David A. G. Deacon, Los Altos; Michael J. Brinkman, Redwood City, all of Calif.

[73] Assignee: Deacon Research, Palo Alto, Calif.

[21] Appl. No.: 389,706

[22] Filed: Feb. 14, 1995

[51] Int. Cl.$^6$ ..................................................... H01S 3/10
[52] U.S. Cl. ........................... 372/22; 372/18; 372/19; 372/20; 372/12; 372/64; 372/28; 372/99; 372/102
[58] Field of Search ................................. 372/22, 18, 12, 372/10, 20, 28, 29, 64, 99, 102

[56] References Cited

U.S. PATENT DOCUMENTS 4,384,760  5/1983  Alferness .

(List continued on next page.)

OTHER PUBLICATIONS

R. L. Abrams and A. N. Chester, "Resonator theory for hollow waveguide lasers," Appl. Opt. 13, 2117 (1974).
R. C. Alferness and L. L. Buhl, "Tunable electro-optic waveguide TE<–>TM converter/wavelength filter," Appl. Phys. Lett. 40, 861 (1982).
D. M. Bird, J. R. Armitage, R. Kashyap, R. M. A. Fatah, K. H. Cameron, "Narrow line semiconductor laser using fibre grating," Electron. Lett. 27, 1116 (1991).
L. Goldberg, D. Mehuys, M. R. Surette, and D. C. Hall, "High power, near–diffraction–limited large–area travelling––wave semiconductor amplifiers," IEEE J. Quantum Electron. 29, 2028 (1993).
F. Heismann, R. C. Alferness, L. L. Buhl, G. Eisenstein, S. K. Korotky, J. J. Veselka, L. W. Stulz, and C. A. Burrus, "Narrow–linewidth, electro–optically tunable InGaAsP––Ti:LiNbO$_3$ extended cavity laser," Appl Phys. Lett. 51, 164 (1987).

F. Laurell, "Stable blue second–harmonic generation in a KTP waveguide with a diode laser in an external cavity," Electron. Lett. 29, pp. 1629–1630 (1993).
H. Nishihara, M. Haruna, T. Suhara, *Optical Integrated Circuits*, (McGraw–Hill, New York, 1985).
Z. Tang, O. Eknoyan, H. F. Taylor, and V. P. Swenson, "Electro–optically tunable wavelength selective polarization convertor in Zn:LiTaO$_3$," Electron. Lett. 28, 2248 (1992).
Bruno Wacogne, Jean–Pierre Goedgebuer, and Henri Porte, "Single lithium niobate crystal for mode selection and phase modulation in a tunable extended–cavity laser diode," Opt. Lett. 19, 1334 (1994).
K. Yamamoto et al., "High power blue light generation by frequency doubling of a laser diode in a periodically domain inverted LiTaO$_3$ waveguide", Appl. Phys. Lett. 62 2599–2601 (1993).
W. P. Risk et al. "Generation of 425 nm light by waveguide frequency doubling of a GaAlAs laser diode in an extended–cavity configuration", CThB3 in Proceedings of the conference on Advanced Solid State Lasers, Feb. 1–4 1993, Optical Society of America, Technical Digest Series vol. 2.

*Primary Examiner*—Leon Scott, Jr.
*Attorney, Agent, or Firm*—Townsend and Townsend and Crew; Kenneth R. Allen

[57] ABSTRACT

A laser cavity configuration employs a mode reshaping structure in a solid state waveguide. The mode reshaping may be by means of an adiabatic taper. Polarization switching may be employed in connection with the mode reshaping to obtain a high output power in a single transverse spatial mode from an integrated external cavity multiple-mode diode laser device. The structure provides stabilization and rapid tuning of the frequency of the diode laser, as well as use substantially all of the available power of the diode laser operating multimode. Various configurations and combinations are described. An advantage is that an integrated structure can provide output of the laser in a waveguide with single mode for subsequent applications. The external cavity diode laser according to the invention is consistent with a planar manufacturing process such that high volume, low cost products can be achieved.

56 Claims, 4 Drawing Sheets

U.S. PATENT DOCUMENTS

| | | |
|---|---|---|
| 4,390,236 | 6/1983 | Alferness . |
| 4,533,207 | 8/1985 | Alferness . |
| 4,667,331 | 5/1987 | Alferness et al. . |
| 4,728,168 | 3/1988 | Alferness et al. . |
| 5,050,179 | 9/1991 | Mooradian . |
| 5,150,374 | 9/1992 | Mooradian . |
| 5,185,752 | 2/1993 | Welch et al. ............................. 372/22 |
| 5,327,447 | 7/1994 | Mooradian . |
| 5,418,802 | 5/1995 | Chwalck .................................. 372/22 |

OPTICAL SOURCE WITH MODE RESHAPING

BACKGROUND OF THE INVENTION

This invention relates to optical sources based on diode laser technology. The present invention relates specifically to a new frequency-selective optical laser source that is electro-optically tunable. It also relates to the development of a single transverse mode laser when excited by a gain region that supports the lasing of many modes (multimode operation). It further relates to the efficient coupling of the output of this laser radiation into single-mode waveguides for subsequent frequency conversion applications.

Power diode lasers are currently commercially available with output power from a single chip in excess of 3 W. The achievement of such high total power in the face of the power density limitation at the facet due to optical damage requires the use of broad area gain sections with emission facet widths of hundreds of microns. These broad area amplification regions inherently allow multiple modes of operation. To limit the operation of these broad area multi-transverse mode diode lasers to a single transverse spatial mode, thus obtaining a diffraction limited output beam, it is necessary to provide some other mechanism to suppress the higher order transverse modes. Achieving frequency control to produce single longitudinal mode operation adds further difficulty. However, many applications require either diffraction limited beams or single frequency beams.

CITATIONS TO PRIOR ART

The following patents and publications are cited hereinafter in connection with a description of the state of the prior art:

| | | |
|---|---|---|
| 5,185,752 | 02/1993 | Welch et. al. |
| 5,050,179 | 09/1991 | Mooradian |
| 5,150,374 | 09/1992 | Mooradian |
| 5,327,447 | 07/1994 | Mooradian |
| 4,384,760 | 05/1993 | Alferness et al. |
| 4,390,236 | 06/1983 | Alferness et al. |
| 4,533,207 | 08/1985 | Alferness et al. |
| 4,667,331 | 05/1987 | Alferness et al. |
| 4,728,168 | 03/1988 | Alferness et al. |

R. L. Abrams and A. N. Chester, "Resonator theory for hollow waveguide lasers," Appl. Opt. 13, 2117 (1974).

R. C. Alferness and L. L. Buhl, "Tunable electro-optic waveguide TE<->TM converter/wavelength filter," Appl. Phys. Lett. 40, 861 (1982).

D. M. Bird, J. R. Armitage, R. Kashyap, R. M. A. Fatah, K. H. Cameron, "Narrow line semiconductor laser using fibre grating," Electron. Lett. 27, 1116 (1991).

L. Goldberg, D. Mehuys, M. R. Surette, and D. C. Hall, "High power, near-diffraction-limited large-area travelling-wave semiconductor amplifiers," IEEE J. Quantum Electron. 29, 2028 (1993).

F. Heismann, R. C. Alferness, L. L. Buhl, G. Eisenstein, S. K. Korotky, J. J. Veselka, L. W. Stulz, and C. A. Burrus, "Narrow-linewidth, electro-optically tunable InGaAsP-Ti:LiNbO$_3$ extended cavity laser," Appl Phys. Lett. 51, 164 (1987).

F. Laurell, "Stable blue second-harmonic generation in a KTP waveguide with a diode laser in an external cavity," Electron. Lett. 29, pp. 1629–1630 (1993).

H. Nishihara, M. Haruna, T. Suhara, Optical Integrated Circuits, (McGraw-Hill, New York, 1985).

Z. Tang, O. Eknoyan, H. F. Taylor, and V. P. Swenson, "Electro-optically tunable wavelength selective polarization convertor in Zn:LiTaO$_3$," Electron. Lett. 28, 2248 (1992).

Bruno Wacogne, Jean-Pierre Goedgebuer, and Henri Porte, "Single lithium niobate crystal for mode selection and phase modulation in a tunable extended-cavity laser diode," Opt Lett. 19, 1334 (1994).

K. Yamamoto et al., "High power blue light generation by frequency doubling of a laser diode in a periodically domain inverted LiTaO$_3$ waveguide", Appl. Phys. Lett. 62 2599–2601 (1993).

W. P Risk et al. "Generation of 425 nm light by waveguide frequency doubling of a GaAlAs laser diode in an extended-cavity configuration", CThB3 in Proceedings of the conference on Advanced Solid State Lasers, Feb. 1–4 1993, Optical Society of America, Technical Digest Series Vol. 2.

DESCRIPTION OF THE PRIOR ART

To obtain diffraction limited output, single mode (SM) diode lasers have been developed where the waveguide confinement and gain region is restricted to a small width (approximately 2–4 microns) such that only a single spatial mode can be supported by the structure. Although this technique produces a single transverse mode laser, the output power is limited by facet damage to approximately 150–250 mW. A means is needed to control the high power available from the wide facet semiconductor lasers and to channel this power optimally into a single transverse spatial mode.

One approach that has been taken to solve this problem is to integrate a single mode diode laser on the same chip as a broad area amplifier, thus forming an oscillator/amplifier configuration. Output powers in the range of 5 watts have been demonstrated using this technique with near diffraction limited beam quality by ♦ L. Goldberg et al., "High power, near-diffraction-limited large-area travelling-wave semiconductor amplifiers," IEEE J. Quantum Electron. 29, 2028 (1993). This approach suffers from uncontrolled phase shifts across the beam which degrade the beam quality and which change with ageing of the device. The phase shifts are difficult to measure or control during production due to the active nature of the devices. A passive device which imposes mode control would be a major advance.

The idea of incorporating waveguides into laser cavities to act as spatial filters has been previously discussed in the prior art by ♦ R. L. Abrams and A. N. Chester "Resonator theory for hollow waveguide lasers," Appl. Opt. 13, 2117 (1974), who discuss hollow waveguide lasers with application to the CO$_2$ laser. These hollow waveguides are fundamentally lossy due to the fact that the index of the guide $n_{guide}$ is much less than the index of the cladding $n_{cladding}$, i.e. $n_{guide} < n_{cladding}$. This results in beam leakage out of the waveguide upon each grazing incidence reflection of the beam from the waveguide wall. Lossless waveguiding structures use a guide index larger than the cladding, i.e. $n_{guide} > n_{cladding}$, and operate from the principle of total internal reflection. ♦ A. Mooradian, in U.S. Pat. Nos. 5,050,179, 5,150,374 and 5,327,447, has disclosed a number of external cavities for diode laser application, designed to limit the oscillator to a single transverse spatial mode. These cavities rely on discrete optical components (bulk optics) to form free space optical cavities. He also discloses cavities that use the lossy, grazing incidence waveguide structure discussed above in relation to Abrams and Chester.

What is needed is a laser configuration capable of concentrating the power available from wide stripe semiconductor laser amplifiers into a single transverse mode. To enable low cost devices, the configuration should also be compatible with planar processing of optical integrated circuits.

The tuning and stabilization of the diode laser wavelength is the second aspect of the mode control problem. In a laser structure confined to produce a beam with a single spatial (transverse) mode, there are still many different optical frequency (longitudinal) modes to choose from. Without frequency control, the laser output phase may be chaotic due to random mode hopping, or multiple frequencies may be present simultaneously. Many applications require either a long optical coherence length or fixed laser frequency. For example, diode laser frequency conversion techniques using QPM (quasi phase matched) structures require that the diode laser wavelength must be tuned and locked to a narrow range of wavelengths (typically within a few tenths of a nanometer) that optimize the conversion efficiency. Again, the selected structure must also be consistent with planar wafer scale processing if a low cost system is to be achieved.

Several frequency doubler configurations have been attempted which use external cavities to control the laser frequency. Two groups have achieved frequency stabilization using weak frequency selective feedback from a grating. In this configuration, the diode laser forms its own laser cavity but is frequency-pulled by weak feedback from the external grating. ♦ F. Laurell, "Stable blue second-harmonic generation in a KTP waveguide with a diode laser in an external cavity," Electron. Lett. 29, pp. 1629–1630 (1993), and ♦ K. Yamamoto et al., "High power blue light generation by frequency doubling of a laser diode in a periodically domain inverted LiTaO$_3$ waveguide", Appl. Phys. Lett. 62 2599–2601 (1993), both disclose a diode laser coupled to a single mode QPM waveguide with external grating feedback from a discrete element grating external to the waveguide. One group has reported frequency stabilization using grating dispersion integrated into the laser cavity: ♦ W. P. Risk et al. "Generation of 425 nm light by waveguide frequency doubling of a GaAlAs laser diode in an extended-cavity configuration", CThB3 in Proceedings of the conference on Advanced Solid State Lasers, Feb. 1–4 1993, Optical Society of America, Technical Digest Series Vol. 2, describe a diode laser operated in an external cavity containing both a QPM waveguide and a bulk grating feedback reflector.

For frequency conversion (e.g. for doubling or optical parametric frequency mixing or oscillation), both tuning and polarization rotation are desirable. The polarization can either be TE (electric vector parallel to the plane) or TM (electric vector perpendicular to the plane), depending on the cut of the nonlinear crystal used in the waveguide doubling operation. However, most diode laser gain media are preferentially polarized in the TE mode, and the easiest to fabricate waveguide frequency converters (e.g. QPM devices in z-cut LiNbO$_3$, LiTaO$_3$, or KTP) require a TM mode interaction. If planar processing is to be used, some method of rotating the laser polarization between the diode laser gain media and the frequency conversion waveguide should therefore be used in the design. The Laurell, Yamamoto, and Risk configurations all use bulk components to accomplish polarization rotation and frequency stabilization. It would be highly desirable to accomplish both the required polarization rotation and the frequency stabilization functions in one integrated structure.

♦ Welch et al., U.S. Pat. No 5,185,752, disclose an external cavity diode laser that uses a single mode diode laser pumping a single mode waveguide with an integrated grating and QPM poled doubling region. It also has no integrated method for providing the TE to TM polarization rotation to optimize the use of TE polarized diode laser gain media. External elements are described for polarization rotation, which require the use, alignment, and packaging of additional external elements such as two lenses and a quarter wave plate. Although the grating stabilizes the frequency, this structure can not be electro-optically tuned and operates at one wavelength for a given temperature. The Welch et al. structure is also limited to using a single-transverse-mode diode laser which fundamentally limits the output power of the laser structure.

Other structures disclosed in the prior art include fiber coupled lasers such as ♦ Bird et al., "Narrow line semiconductor laser using fibre grating," Electron. Lett. 27, 1116 (1991), who show a single-mode laser coupled to a single-mode fiber with grating feedback from the fiber, and bulk optic coupled lasers such as ♦ Wacogne et al. "Single lithium niobate crystal for mode selection and phase modulation in a tunable extended-cavity laser diode," Opt.Lett. 19, 1334 (1994), who disclose a diode laser cavity with bulk optics including electro-optic tuning.

♦ Alferness et al., U.S. Pat. Nos. 4,667,331 and 4,728,168, disclose an external cavity diode laser with electro-optic control. They suggest, without further description, that their structure can be used for tuning the composite cavity over a range of wavelengths using wavelength selective filters previously disclosed in ♦ Alferness et al. U.S. Pat. Nos. 4,384,760, 4,390,236, and 4,533,207. The actual realization of a device based on the initial suggestion apparently had to wait until the work reported in ♦ Heismann et al. "Narrow-linewidth, electro-optically tunable InGaAsP-Ti:LiNbO$_3$ extended cavity laser," Appl Phys. Lett. 51, 164 (1987). The external laser cavity is fabricated using a single titanium indiffused waveguide that supports both TM and TE polarization modes. The device required the use of an integrated thin film polarizer in order to limit the polarization to the TE mode prior to the output reflecting mirror. This design is incapable of producing a TM polarized mode in the output waveguide. TM output modes are required in at least two important application areas: frequency doubling of diode lasers and optical switching networks for fiber optic communication. In diode laser frequency doubling, the most efficient doubler designs in z-cut ferroelectric materials require a TM mode input. In optical switching networks, near-90° grating routers can only reflect TM energy because of the Brewster angle.

A second problem with the laser design realized by Heismann et al. is that the integrated thin film polarizer is a lossy element (as discussed for example by ♦ H. Nishihara, M. Haruna, T. Suhara in the book Optical Integrated Circuits) and it would be advantageous to replace this polarizer with a lower loss structure.

A third problem with the Heismann et al. laser cavity design is that the device can not be packaged in the planar configuration since the diode laser must be mounted with its fabrication plane perpendicular to that of the wavelength selective filter. Since the output of the thin film polarizer is TE, the input to the polarization rotator must be TM. This is achieved by rotating the (TE) diode laser 90° relative to the plane of the wavelength filter. Since the diode laser and filter chips are no longer coplanar, four transverse degrees of freedom must be controlled mechanically during the alignment process. By contrast, in the planar mounting configuration, only two transverse degrees of freedom must be controlled, a significantly easier problem. It would be highly advantageous to develop a tunable wavelength filter structure which is fully compatible with planar processing and alignment techniques.

SUMMARY OF THE INVENTION

According to the invention, a laser cavity configuration employs a mode reshaping structure in a solid state waveguide. The mode reshaping may be by means of an adiabatic taper. Polarization switching may be employed in connection with the mode reshaping to obtain a high output power in a single transverse spatial mode from an integrated external cavity multiple-mode diode laser device. The structure provides stabilization and rapid tuning of the frequency of the diode laser, as well as use substantially all of the available power of the diode laser operating multimode. Various configurations and combinations are described. An advantage is that an integrated structure can provide output of the laser in a waveguide with single mode for subsequent applications. The external cavity diode laser according to the invention is consistent with a planar manufacturing process such that high volume, low cost products can be achieved.

The invention will be best understood upon reference to the following detailed description in connection with the accompanying drawings.

DESCRIPTION OF SPECIFIC EMBODIMENTS

Figure 1:
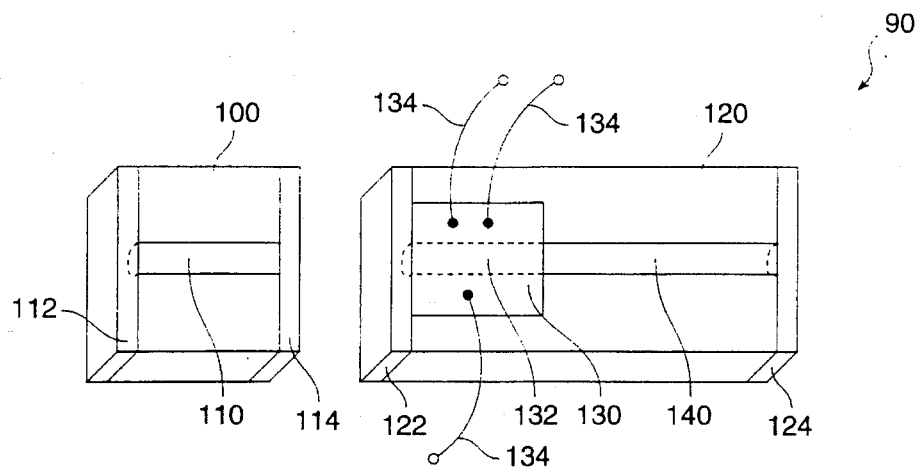
FIG. 1 is a top perspective view of a first external cavity laser system containing a polarized laser gain media, the polarization selective wavelength filter and the polarizing waveguide structure.

FIG. 1 illustrates a frequency selected external cavity laser structure 90 containing a solid state optical tuning structure, also called a polarization selective wavelength filter 120, coupled to a laser gain medium 100. A resonant cavity is established between a first optical reflector 112 and a second optical reflector 124 along an optical path defined by the closed trajectory followed by the optical energy of the system. In the preferred configuration, 112 is a high efficiency reflector and 124 is a feedback reflector. The optical radiation is coupled out of the resonant cavity by properly designing the reflectivity of the feedback reflector 124, allowing some transmission. Interposed on the optical path is a solid state polarized optical gain medium 100, also called a polarized optical exciter, which emits and amplifies light of a dominant polarization within a limited optical bandwidth. By light, we mean electromagnetic radiation of any frequency, not exclusively within the visible region of the spectrum. The optical radiation propagating within the cavity forms a beam which occupies the region 110 of the gain medium. The beam emerging from the gain medium 100 is optically coupled into a waveguide 132 in the wavelength filter 120. The coupling is adjusted to optimize the fraction of the power emerging from the gain medium 100 which is coupled into the waveguide 132. The power propagating in the waveguide is retroreflected by the feedback reflector 124, and is coupled back into the beam 110.

The polarized solid state gain medium may be a Nd:YAG laser pumped by a variety of sources including lamps and other lasers, or it may be another lasing material such as is known in the art or yet to be discovered. Examples include optically transparent glassy or crystalline substrates doped with rare earth ions such as Nd, Pr, Yb, Tm, etc., and other ions such as V, Cr, etc. The gain medium may also be an electrically pumped material such as doped GaAs, GaN, AlN, SiC, InP, etc. Polarization may be ensured in these media by incorporating a Brewster surface or other type of polarizing element. Due to the high electrical efficiency and wafer scale production capability, the preferred gain medium is a polarized diode laser. The region 110 is preferably a single-transverse mode waveguide fabricated within a spatially delimited gain region.

Diode laser gain media typically provide higher gain in the TE polarization mode than in the TM mode. This is due both to the higher TE reflectivity at the facets, and to the presence of compressive strain in the active layer which is at present required for InGaAs diode lasers operating at 980 nm. While it is possible in principle to produce gain media with higher gain in the TM mode by using tensile strain, it is not yet clear that tensile strain will be compatible with long lifetime devices. The laser gain medium illustrated in FIG. 1 is TE polarized. The energy from this gain media forms an optical source called the first polarized optical energy. The diode laser gain medium has an anti-reflection coating 114 on one facet. A polarization selective wavelength tuning structure 120, with one end having an anti-reflection coating 122, is butt coupled to the diode laser gain medium 100. Butt coupling refers to coupling between two waveguide devices wherein no discrete elements are disposed between the devices, and the energy emerging from one device is coupled into the other by diffraction. Butt coupling is optimized in optical wavelength devices by a) arranging the mode sizes and shapes to be nearly equal, b) reducing the separation of the two devices to less than about a Rayleigh range, and c) by aligning their modes coaxially.

The tuning structure 120 is comprised of a first waveguide 132 that supports both TE and TM polarizations, integrated into the wavelength, or frequency, selective polarization converter 130, and a second waveguide segment 140 that supports a single polarization only. The waveguide 132 couples the first port of the polarization converter 130 to the second, or output port that is connected to waveguide segment 140. The converter and the waveguides are preferably integrated onto the same substrate, and the substrate is preferably lithium niobate. The polarized gain medium 100 and the waveguide segment 140 preferably form an set of orthogonally oriented polarizers so that the waveguide is TM polarized for the TE laser configuration shown in FIG. 1. However, the output of the polarization converter, called the second polarized optical energy, need only be differently polarized from the first polarized optical energy for the structure to function.

Waveguide segment 140 is preferably constructed using annealed proton exchange (APE) in a z-cut ferroelectric crystalline substrate. It is known in the art that the APE waveguide supports only the modes polarized with the electric vector parallel to the z-axis in ferroelectric crystals such as lithium niobate and lithium tantalate. In z-cut crystalline material, this corresponds to TM polarization, and in x or y-cut ferroelectric crystalline material, to TE polarization. (Z-cut crystals are cut so that the z-axis of the crystal is normal to the surface of the sample; x- or y-cut crystals are cut so that the x- or y-axis of the crystal is normal to the surface.) The APE waveguide segment 140 forms an exceptionally low loss integrated polarizer.

The waveguides 132 and 140 must be well aligned relative to each other, and their fabrication conditions are preferably adjusted to produce similar transverse mode sizes so as to optimize the coupling between them. These waveguides are also butt coupled, and the discussion on butt coupling optimization applies to their coupling also. Since they are fabricated on the same substrate, the coaxial alignment is accomplished by microlithography. The processing of the waveguides is optimized to produce similar transverse mode sizes and shapes. If the waveguide 132 is produced by the titanium indiffusion process in lithium niobate, for example, it will be fabricated first because of its high temperature (near 1100° C.). The waveguide 140 may then be fabricated with APE (anneal temperature near 330° C.) without substantially altering the mode characteristics of the waveguide 132. The longitudinal location of the "ends" of the two waveguides is also of importance although there need be no separation between the two guides. Since the guiding effect tapers away longitudinally at the end of each waveguide, the separation (or overlap) of the waveguide ends can be adjusted so that the tapering rate of the two waveguides (one tapering off and the other tapering on) cancel each other out to lowest order, resulting in the lowest loss junction. This end can be achieved approximately by having the photolithographic mask for the two guides start and end at the same longitudinal point.

Located somewhere along the waveguide 132 is a wavelength selective polarization converter 130. The polarization converter 130 causes the conversion of a TE (or TM) polarized beam entering the first port into a TM (or TE) polarized beam at the second port. Thus a low-loss longitudinally-twisted polarization mode is made to resonate in the laser cavity formed by mirrors 112 and 124. The design and fabrication of wavelength selective polarization mode converters, also known as an electro-optically tunable TE-TM converter, are well known in the art. (Examples of several different designs for this polarization converter have been disclosed by Alferness in U.S. Pat. Nos. 4,384,760, 4,390,236, and 4,533,207, and in "Tunable electro-optic waveguide TE-TM converter/wavelength filter" *Appl. Phys. Lett.* 40 861–862 (1982). The Alferness et al. designs require electronic excitation and permit electronic tuning. Tang et al., in "Electro-optically tunable wavelength selective polarization convertor in Zn:LiTaO$_3$," *Electron. Lett.* 28, 2248 (1992), disclose a stress-actuated design of a tunable TE-TM polarization converter. Nishihara et al. in Optical Integrated Circuits, [McGraw-Hill, New York, 1985], describes several alternative designs which include acousto-optic excitation.) Conventionally, an electro-optic switch or an acousto-optic switch that causes switching between two different, but not necessary orthogonal, polarization states in a wavelength selective manner can be used for this application.

All structures are fabricated from an electro-optically-active crystalline material that has off-diagonal electro-optic coefficients (such as $r_{31}$ or $r_{51}$) that can be used for TE-TM conversion. The magnitude of the applied electric field or voltage (or the applied stress) is adjusted to produce full polarization conversion at the desired wavelength. In the tunable structures, a separate voltage is required to adjust the central wavelength, also called the center frequency, of the device. These voltages are applied through electrode connections 134. If the device is fabricated according to Alferness, three electrodes may be used, while the Tang design only requires two. In either case, the center frequency of the device is electrically tunable by applying an electric field to the structure.

The waveguide 132, which supports both TE and TM modes, is preferably fabricated by a process called indiffusion in which titanium is in-diffused into the material. (Alternative ions include Zn). Because of its locally-periodic, multi-element nature, a long polarization converter can be highly wavelength selective, such that only a narrow band of wavelengths undergo exactly a 90-degree rotation of the polarization state. Thus a locally-periodic frequency selective structure which is electronically switchable is formed. While the gain medium 100 may emit and amplify light over a wide bandwidth, only a narrow band of wavelengths in the passband of the converter will be rotated to the polarization which is passed without loss by the waveguide segment 140. All other wavelengths have their polarization state converted to a mixed TE-and-TM state, and according to the invention experience substantial loss when propagating in the polarized waveguide segment 140. This difference in loss at the different wavelengths is large enough to cause the external cavity diode laser 90 to oscillate only within the narrow band of wavelengths that undergo the full TE-to-TM conversion. Other wavelengths are held below threshold. This tunable TE-TM converter allows the fundamental frequency—defined as the optical frequency amplified by the gain medium—of the laser structure to be tuned over the gain bandwidth of the diode laser gain medium.

The present polarized waveguide design for the frequency selected external cavity laser structure device of FIG. 1 has several distinct advantages over the prior art. First, it allows use of the high-gain TE mode of the semiconductor diode gain medium coupled with the low-cost planar butt coupling approach to z-cut lithium niobate integrated optical devices. By using a second, polarized waveguide 140 configured behind the unpolarized waveguide 132, a low-loss configuration is obtained which is compatible with components including frequency doublers and grating reflectors. Using either APE or tapered-to-below-cutoff waveguides that have a weak-guiding configuration that is insufficient to support the guiding of TE-polarized optical energy, either TE or TM polarizers can be achieved. On z-cut lithium niobate, APE produces a TM polarized waveguide, while on x- or y-cut lithium niobate, APE results in a TE-polarized waveguide. As an alternative, a low-loss TM polarized waveguide may be formed in most substrates, as is shown in Thaniyavarn et al., U.S. Pat. No. 4,697,868. A TM-polarized waveguide section is formed from a narrow or low dopant density waveguide design to operate at a level where the TE mode is below cutoff but the TM mode is guided. The waveguide segment will optimally have to include tapered ends to mode match to the waveguides with support both polarizations. The tapering requirement is a significant disadvantage since the taper must be adiabatic for low loss, but adiabatic tapers are very long. For geometrically-compact devices, the APE fabrication technique for the polarized waveguides is much preferred. All of these waveguide segments are fabricated in optically-transmissive solid state material. By optically-transmissive material, what is meant is any optical material with a low enough absorption loss at the laser wavelength such that the laser can reach lasing threshold.

The basic structure described above may be modified in many inessential ways while preserving the basic functions as described above. For example, methods other than butt coupling can be used to couple the laser gain medium 100 to the wavelength tuning structure 120, including prism coupling, bulk optics configurations of lenses, and fiber coupling techniques, some of which are known in the art. Although the high-efficiency reflector is described as being located on one facet of the diode laser gain medium 100 in FIG. 1, there are other applications where the high efficiency reflector 112 and the feedback reflector 124 would have their reflectivities and transmissivities interchanged, thereby interchanging the end of the laser cavity from which the laser beam projects. It may be desirable to extract optical radiation from several locations rather than just one: both reflectors at the cavity ends may be somewhat transmissive, or components within the resonator (e.g. a grating) may be designed to out-couple a fraction of the circulating power.

The polarization-selective wavelength filter 120 may also be a part of a larger integrated optic structure fabricated on a common substrate. The reflector 124 may be implemented other than as a multilayer coating, such as a retroreflecting Bragg grating structure or as one or more vertical-walled grooves normal to the waveguide propagation direction. A Bragg grating is another example of a locally-periodic frequency selection structure. If the Bragg grating is fabricated in an electro-optically active substrate such as lithium niobate, the grating can be made to be electro-optically tunable. In addition, if the Bragg grating is fabricated from periodically-poled ferroelectric domain structures similar to those used for the periodically-poled frequency converter 320, an electrically-controlled poled structure is formed that can act as a grating reflector by applying a voltage to a set of electrodes located near the poled structure. The details of the fabrication of this electrically-controlled poled grating reflector have been described by Deacon Research in U.S. patent application Ser. No. 08/239,799 filed May 9, 1994, inventors Simon J. Field and David A. G. Deacon, and incorporated herein by reference, so as not to need to be repeated herein. The substrate may be one of many alternative materials to lithium niobate, such as lithium tantalate, KTP, or any other electro-optic material with an electro-optic coefficient which couples TE and TM waves and is transparent in the desired wavelength region.

In the preferred embodiment illustrated in FIG. 1, the tuning structure 120 is fabricated in z-cut lithium niobate, and the waveguide segment 140 is fabricated using APE and therefore supports the propagation of a TM polarized mode. The diode laser gain medium 100 is TE polarized and the wavelength selective polarization mode converter 130 converts TE polarization to TM polarization which then propagates in waveguide segment 140 without loss. The TM polarized optical signal reflected off of the feedback reflector 124 is directed back through the converter 130 and is converted back into a TE polarized optical signal which is propagated back along the first waveguide 132, and which is coupled into the diode laser gain medium 100. The frequency selected optical signal is amplified in the gain medium 100 and reflected from the mirror 112. Since the selected frequencies are preferentially fed back into the gain medium, the operating frequency of resonator beam is narrowed and stabilized to the pass frequency of the TE-TM converter.

In an alternate embodiment, the tuning structure 120 is fabricated in x or y-cut lithium niobate, and the waveguide segment 140 is fabricated using APE, yielding a TE polarized waveguide. The diode laser gain medium 100 must then be designed to be TM polarized, using methods known to the art such as tensile strain. The wavelength selective polarization mode converter 130 then converts the TM laser polarization to TE polarization which propagates in waveguide segment 140 without loss. The TE polarized optical signal reflected off of the feedback reflector 124 is directed back through the converter 130 and is converted back into a TM polarized optical signal to be propagated along the first waveguide 132, coupling and frequency stabilizing the diode laser gain medium 100. The optical signal then reflects off of the high efficiency reflector 112 and propagates back though the gain medium thus forming an optical laser resonator.

In a second alternate embodiment, the tuning structure 120 is fabricated in x- or y-cut lithium niobate, and the waveguide segment 140 is fabricated using APE, but the diode laser gain medium 100 is TE polarized. The wavelength selective polarization mode converter 130 converts TE polarization from the gain medium through TM and back into TE polarization at the center of the passband of the converter. In this configuration, the mode converter 130 is twice the length (all other things being equal), and can be thought of as consisting of two back-to-back TE-TM converters placed in phase. Away from the center of the passband, the input TE light is not fully converted from the input TE mode to the output TE mode and suffers additional loss in the TE polarized waveguide segment 140. The structure 90 with TE—TE conversion therefore is limited to gain media 100 with gain bandwidths comparable to the width of the passband.

Wavelengths far outside the passband remain essentially unperturbed, and can propagate uncontrolled in the resonator. These far wavelengths are potentially a problem if the bandwidth of the laser gain medium is wide enough to support significant amplification outside the passband of the filter. Broadband gain media such as semiconductor diode media may need an additional component added to the structure to attenuate these far wavelengths. A segment of TM-polarized waveguide placed between the two back-to-back TE-TM converters as illustrated in FIG. 2 effectively eliminates the far wavelengths and provides additional discrimination within the passband, without affecting the transmission at the peak of the passband.

Figure 2:
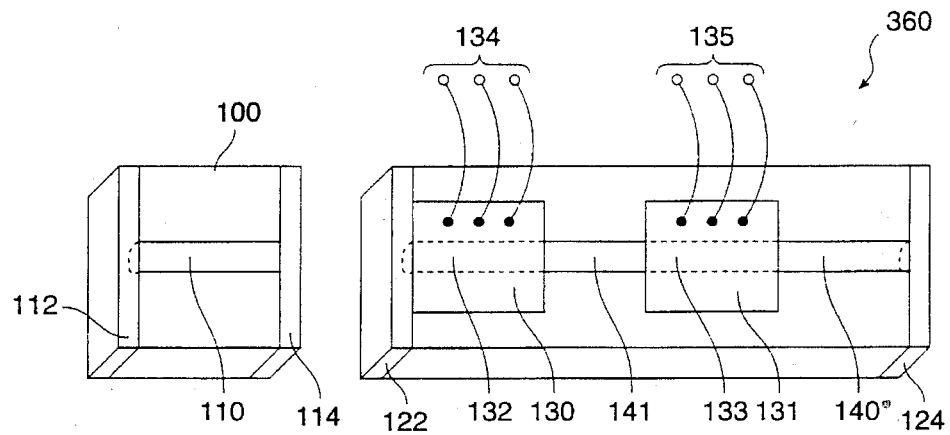
FIG. 2 is a top perspective view of a second frequency selected external cavity laser structure containing two TE-TM converters with a polarizing waveguide segment.

FIG. 2 shows a frequency selected external cavity laser structure 390 containing two TE-TM converters 130 and 131 with a polarized waveguide segment 141 between waveguide segments 132 and 183. The device 360 is the same as the device 90 except for the addition of the extra TE-TM converter 131 with its leads 135, and the addition of the polarized waveguide segment 141 between the two converters 130 and 131. The device 360 may be operated either in TE—TE mode or TM—TM mode. In TE—TE mode, the gain medium 100 is TE polarized, and the converter 130 converts light at a specific wavelength to TM polarization. The polarized waveguide 141 is TM polarized and propagates only the TM polarized component of the output from the TE-TM converter 130 to the input of the TE-TM converter 131, which rotates the specific wavelength to TE polarization. The waveguide 140 is TE polarized, and transports only the TE polarized component to the reflector 124. Optimally, the separation of the two converters 130 and 131 is adjusted for them to be in phase, which means that the polarization conversion process begins at the start of the section 131 phased as if there were no waveguide between them. As before, only light with frequencies very close to that of the specific wavelength can propagate with low loss within the resonator.

In TM—TM mode, the gain medium 100 is TM polarized, and the converter 130 converts light at a specific wavelength to TE polarization. The polarized waveguide 141 is TE polarized and propagates only the TE polarized component of the output from the TE-TM converter 130 to the input of the TE-TM converter 131, which rotates the specific wavelength to TM polarization. The waveguide 140 is TM polarized, and transports only the TM-polarized component to the reflector 124. As before, only light with frequencies very close to that of the specific wavelength can propagate with low loss within the resonator.

Figure 3:
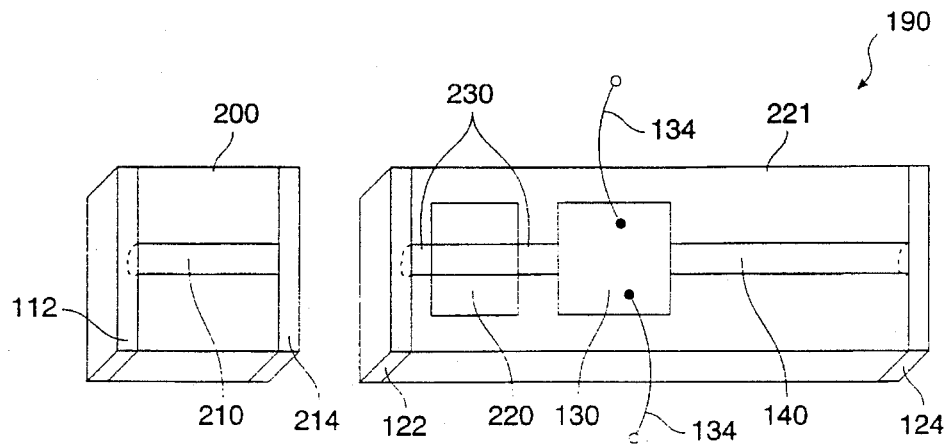
FIG. 3 is a top perspective view of an alternate embodiment of an external cavity laser system according to the invention containing an unpolarized gain, an integrated thin-film polarizer, a polarization selective wavelength filter, and an output polarizing waveguide structure.

FIG. 3 illustrates a frequency selected external cavity laser structure 190 containing a polarizer 220. A resonant cavity is established between reflectors 112 and 124 along an optical path defined by the closed trajectory followed by the optical energy of the system. In the preferred configuration, 112 is a high efficiency reflector and 124 is a feedback reflector. The optical radiation is coupled out of the resonant cavity by properly designing the reflectivity of the feedback reflector 124. Interposed on the optical path is a solid state optical gain medium 200 which emits and amplifies dominantly unpolarized light within a limited optical bandwidth. The optical radiation propagating within the cavity forms a beam which occupies the region 210 of the gain medium. The gain medium is preferably a diode laser chip, and the region 210 is preferably a single-transverse mode waveguide. The diode laser gain medium has an antireflection coating 214 on one facet. A wavelength tuning structure 221, with one end having an anti-reflection coating 122, is butt coupled to the diode laser gain medium.

The tuning structure 221 is comprised of a first waveguide 230 that supports both TM and TE polarizations and is integrated into wavelength selective polarization converter 130. An integrated TE pass polarizer 220 is fabricated on top of waveguide segment 230. The TE polarizer can be implemented as a metal thin-film attenuator separated from the waveguide by a buffer layer as described in H. Nishihara, M. Haruna, T. Suhara, Optical Integrated Circuits, (McGraw-Hill, New York, 1985). Or, it can be an APE waveguide segment if the wavelength tuning structure 221 is fabricated on x- or y-cut substrate material. The polarizer 220 passes TE polarization and attenuates TM polarization. A second waveguide segment 140 supports only TM polarization and is preferably fabricated using APE. In x- or y-cut material, it would be a tapered waveguide with a narrow or low doping density section in which the TE polarized modes are cut off. The TE polarizer 220 and the waveguide segment 140 form a set of orthogonally oriented polarizers.

Interposed between the two waveguides is the wavelength selective polarization converter 130 that has been previously described. The polarization converter 130 causes the switching of a TE polarized beam to a TM polarized beam as the beam passes through the structure. In the embodiment illustrated in FIG. 3, the tuning structure 221 is fabricated in z-cut lithium niobate, and the waveguide segment 140 is fabricated using APE and therefore supports the propagation of a TM polarized mode. The wavelength selective polarization mode converter 130 converts TE polarization to TM polarization which then propagates in waveguide segment 140 without loss. The TM polarized optical signal reflected off of the feedback reflector 124 is directed back through the converter 130 and is converted back into a TE polarized optical signal to be propagated along the first waveguide 230, through polarizer 220, so that it couples into and frequency stabilizes the unpolarized diode laser gain medium 200. The optical signal then reflects off of the high efficiency reflector 112 and propagates back though the gain medium thus forming an optical laser resonator.

The alternative configurations described above in reference to FIG. 1 also apply here, as is the case in the structures further described below. For brevity, these variations will not be repeated with each structural alternative.

Figure 4:
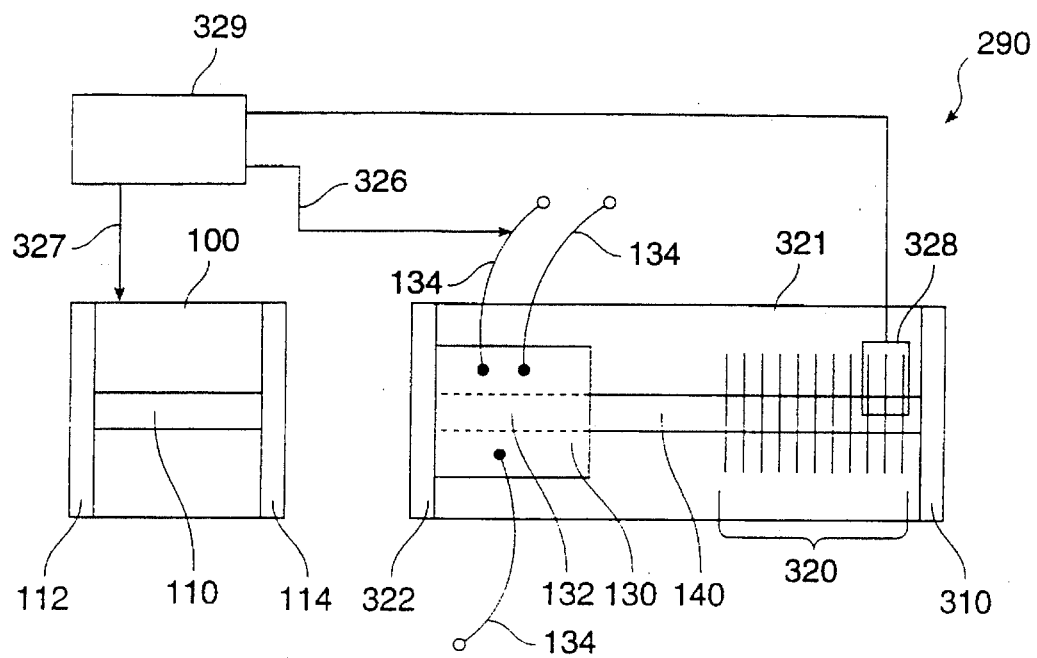
FIG. 4 is a top plan view in partial schematic of an external cavity laser system containing an integrated quasi-phase matched frequency converter.

FIG. 4 illustrates a frequency selected external cavity laser structure 290 containing an optical frequency conversion means 320, preferably a periodically-poled frequency converter. The polarization selective wavelength filter 130 in combination with the polarized waveguide 140, the reflectors 112 and 310 and the gain medium 100, operate as described above to produce laser operation at a fundamental frequency. The frequency is selected and stabilized by the filter 130, and the polarization is rotated from TE which is desirable for the amplifier medium to TM which is desirable for the frequency conversion. The frequency converter 320 converts optical energy at the fundamental frequency of the diode laser to a harmonic, or multiple, of the fundamental optical frequency. For doubling, the harmonic frequency is twice the fundamental frequency. The optical energy at the double frequency is called the converted optical energy. The frequency converter 320 is preferably a quasi phase matched structure fabricated in a TM polarized waveguide segment 140. The integrated structure 321 is fabricated from z-cut ferroelectric crystalline material such as lithium niobate and the TM polarized waveguide segment 140 is fabricated using APE.

The periodically poled frequency converter 320 could be any of the periodic frequency selective structures which are known in the art as shown for example in the Welch et al. patent (U.S. Pat. No. 5,185,752). Either indiffusion, outdiffusion, E-field poling, or one of many other techniques can be used to fabricate the periodic ferroelectric domain structure necessary for the quasi-phase matching process. For example, in lithium niobate the ferroelectric polarized domains need to be reversed by 180 degrees with a period of approximately 4.5 microns to achieve first order doubling of 980 nm to the wavelength of 490 nm. The length of the integrated doubler 320 would typically be approximately 1 cm (depending on the input power) to achieve good conversion efficiency. FIG. 4 illustrates the location of the frequency doubler 320 to be between the output reflector 310 and the polarization converter 130, and therefore it is part of the external cavity diode laser structure. In this case, the feed back reflector 310 would be designed to transmit the frequency doubled light while reflecting most of the fundamental diode laser radiation. Preferably the other face of the structure 321 will have a dichroic reflecting coating 322 that is antireflecting for the fundamental and high reflecting for the second harmonic. The blue light may also be extracted in other ways, including at least: extraction out of the plane of the integrated structure 321 using a grating coupler;

evanescent coupling into a parallel waveguide; and grating reflection into another waveguide segment.

For the case of diode laser doubling, the bandwidth of the periodically-poled frequency converter can be as narrow as 0.1 nm. This bandwidth is known as the acceptance frequency range for the frequency converter. In this case, the fundamental frequency of the diode laser should be tuned to the wavelength that optimizes the doubling efficiency by adjusting the tuning voltage on the leads 134 to the wavelength selective polarization converter 130. A major advantage of our invention is that we provide the ability to easily tune the laser frequency to the wavelength of peak efficiency for the frequency conversion. It is much easier to adjust a voltage than to obtain precise control over all the fabrication conditions influencing both the doubler center frequency and the resonator frequency. The output of the frequency doubled optical radiation may be monitored using a photodiode 328 and an electronic stabilization feedback loop may be used to tune the frequency and amplitude of the fundamental laser frequency to continuously optimize and stabilize the intensity of the frequency doubled optical radiation. The feedback control electronics 329 receives the signal from the photodiode 328, derives error signals, and sends control signals through lines 326 to the tuner 130 to control the frequency of the resonator and through line 327 to the gain medium 100 to control the fundamental power. The two errors signals may be derived from a single photodiode output by, for example, modulating the amplitude and the frequency with different periods and extracting the error signals with phase sensitive electronics.

Figure 5:
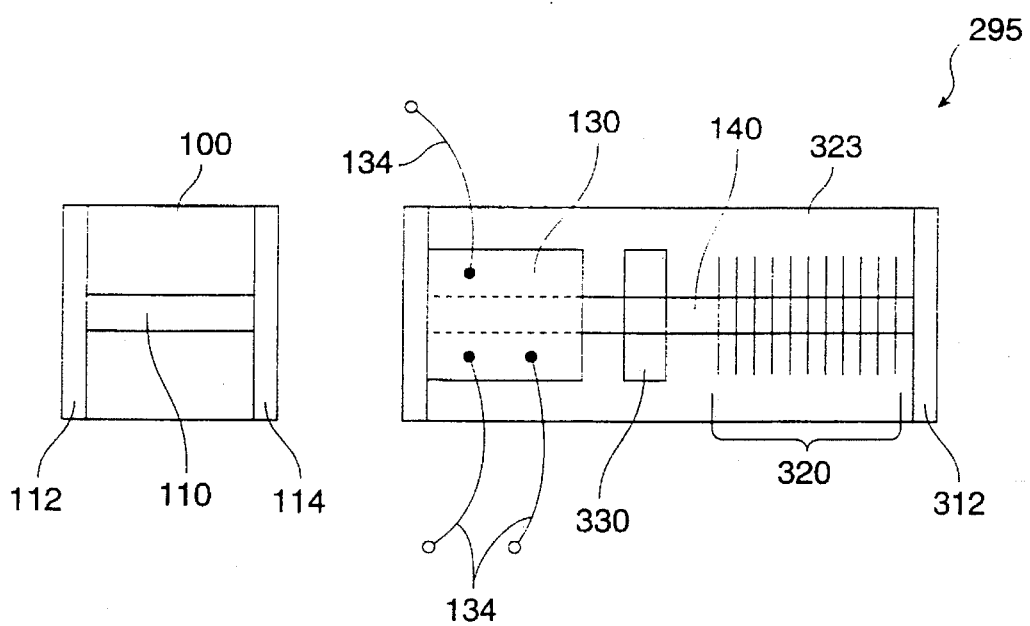
FIG. 5 is a top plan view in partial schematic of a frequency selected external cavity laser structure containing an integrated reflector between the quasi-phase matched frequency converter and the wavelength selective polarization converter.

FIG. 5 illustrates a frequency selected external cavity laser structure 295 containing an integrated reflector 330 between the frequency converter 320 and the wavelength selective polarization converter 130. In this alternate embodiment, the frequency converter 320 lies physically outside the external cavity resonator but still within the integrated polarization selective wavelength filter 323. The feedback reflector 330 for the external diode laser cavity is fabricated in the polarized waveguide segment 140. In this case, the periodically-poled frequency converter 320 receives the optical radiation transmitted by the feedback reflector 330. In this manner, the laser cavity and the frequency doubler can be independently optimized. The combination of frequency selective polarization converter 130 and a frequency selective feedback reflector 330 (such as the grating reflector discussed below) can also act as a mode locker to generate short laser pulses and as an amplitude and/or frequency modulator, in addition to its function as laser frequency tuner, by applying the proper voltages to the leads 134.

The feedback reflector 330 can be constructed using, for example, a grating reflector. The grating may be designed with a strong chirp to produce a bandwidth much broader than that of the wavelength selective polarization converter 130. In this manner, the fundamental wavelength of the diode laser can still be tuned within the bandwidth of the grating reflector 330, for optimization of the frequency doubling. Both indiffusion and etching techniques can be used to fabricate the grating feedback reflector structure 330. The reflector can alternatively be a coating disposed between two butt coupled chips which make up the integrated polarization selective wavelength filter 323, or it may be one or more narrow grooves with vertical walls etched or ablated into the substrate material normal to the axis of the waveguide.

In both FIGS. 3 and 4, the wavelength selective polarization converter 130 can be used to modulate both the amplitude and the frequency of the frequency doubled radiation. Amplitude modulation can be accomplished by adjusting the drive current of the diode laser. In this case, the doubling efficiency will also be reduced, thereby achieving a large amplitude modulation of the frequency doubled radiation. Frequency modulation of the frequency doubled radiation can be achieved by tuning the wavelength of the external cavity laser structure within the acceptance bandwidth of the periodically poled frequency doubler by adjusting or modulating the voltage on the tuning electrodes 134. Wider tuning requires modifying the center frequency of the frequency converter by one of the means such as by electro-optic tuning or by thermal tuning.

In addition to the frequency doubler configuration, the structure of FIG. 5 may be used as a tunable integrated optical parametric oscillator (OPO) which uses the fundamental power to generate both a signal, also called the first output signal, and an idler frequency, also called the second output signal. The requirement for operation of the OPO is governed by principle of the conservation of energy. This requires that the sum of the first and second optical frequencies is equal to the fundamental laser frequency. In this case, the reflector 312 is a high reflector for the both the fundamental and the signal frequency. The reflector 330 is a high reflector for the signal frequency, making an oscillator at the signal frequency containing only the nonlinear frequency conversion structure 320. The pump is resonant between the reflectors 312 and 112; 114 is an antireflection structure eliminating any reflections at the junction between the amplifier 100 and the structure 323. The reflector 330 may also be a high reflector for the idler frequency, but reflector 312 is transmissive at the idler frequency for efficient extraction. The waveguide 140, if it is single mode at the pump wavelength, will probably be below cutoff at the idler frequency, so that the idler power is emitted into free space from the line source represented by the waveguide 140 in the converter 320. If the waveguide 140 is single mode at the idler frequency, the idler will also be confined and the idler power will be emitted as a single transverse mode. However, the waveguide 140 will then be multimode at the pump frequency, and cannot be efficiently coupled with the single mode waveguide 132 within the polarization converter 130. A solution to this difficulty is to taper the waveguide 140 between optimal pump mode overlap with the mode of waveguide 132 to single idler mode within the frequency converter 320. The taper should preferably be accomplished between the polarization converter 130 and the reflector 330 so that any additional loss in the taper will be experienced only at the pump frequency.

The frequency of converted optical energy can be tuned in a controlled manner by electro-optically tuning the bandpass characteristic of the polarization converter 130. This tuning can be accomplished within the acceptance frequency range of the nonlinear frequency converter 320. This acceptance range can be designed to have an arbitrary width using techniques known to the art to meet specific application requirements.

A further variation on the structure shown in FIG. 4 is a frequency mixer. Multiple independent laser sources are required. Each individual laser source can be frequency selected in a similar way to that described above. Each laser has its own TE-TM converter and experiences feedback (which may be wavelength independent) to form an external cavity resonator with a tunable or selectable frequency. The power generated from the individual frequency selected laser sources may be combined using one or more combiner devices such as a frequency selective directional coupler as is known in the prior art. The combined frequencies may be mixed in the frequency converter section to produce an output beam with a frequency equal to a linear combination of the input frequencies. A linear combination of frequencies means the sum of the individual frequencies, which in this context means a sum of multiplied frequencies, where a multiplied frequency is one of the frequencies of an input beam multiplied by an integer (including zero and negative numbers). If for example two independent frequencies are input to the frequency converter, sum frequency mixing can be obtained (the two multiplying integers are equal to +1) or difference frequency mixing can be obtained (one multiplying integer is +1 and the other is −1). Successive mixing or doubling steps are described by larger integers such as 2 or higher.

In FIG. 5 the frequency converter is placed outside the resonator cavity near the outcoupling element 330. If the mirror 112 or some other optical port is the output coupler, the frequency converter may alternately be placed in the optical path beyond the other output coupler, with appropriate coupling, mounting, and aligning means as is known in the art.

Figure 6:
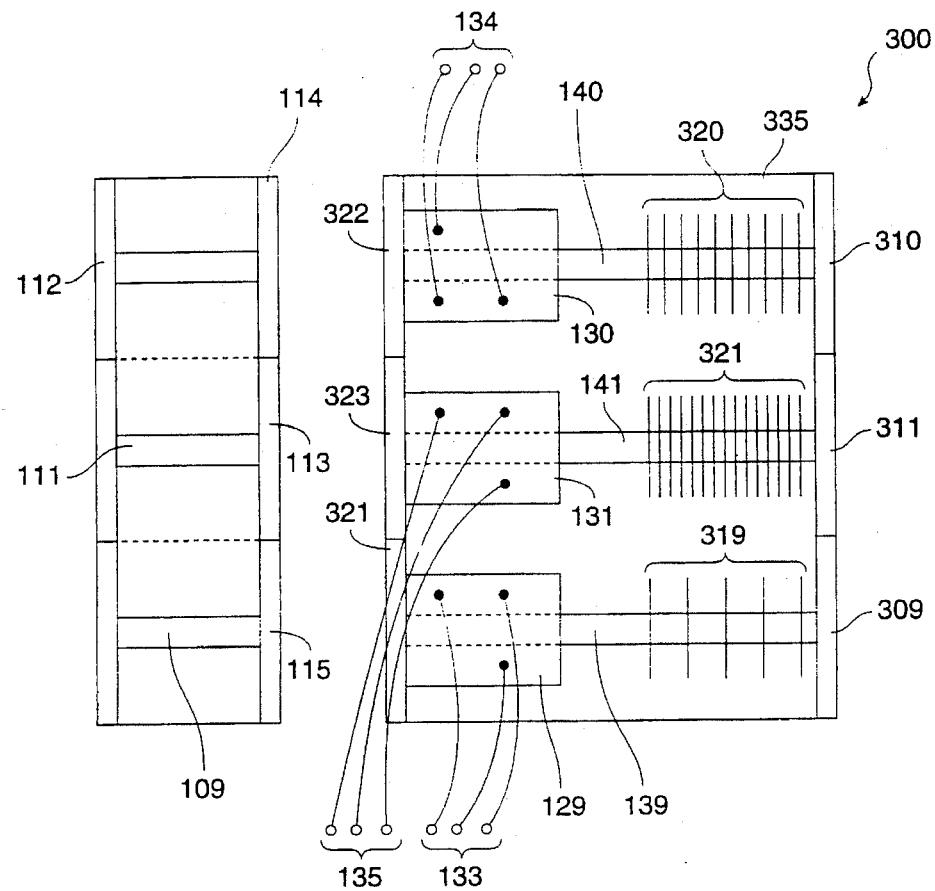
FIG. 6 is a top plan view in partial schematic of an array of frequency selected external cavity laser structures integrated into the same substrate.

FIG. 6 illustrates an array of three frequency-selected, external cavity, frequency doubled laser sources that have been fabricated into a single integrated structure 300. The components of the array have been previously described in FIGS. 4 and 5, and only the differences will be described here. This array structure can include an arbitrary number of laser sources. FIG. 6 illustrates three frequency doubled laser sources in a configuration that would be used as the source for a red (R), green (G), blue (B) display application. The diode laser gain media 110, 111, or 109 can either have the same peak emission wavelengths or different peak emission wavelengths. For example, if device 300 is a RGB laser source for a color display application, the wavelength of the emission peak for infrared diode laser gain media 110 would be centered around 1220 nm, for gain media 111 around 1040 nm and for gain media 109 around 960 nm. (Alternately, the infrared gain media 110 at 1220 nm could be replaced with a red diode laser gain media operating between 620 and 630 nm. This configuration is not shown in FIG. 6.) These infrared gain media could be fabricated on a single semiconductor chip using techniques known to the art, or they could be fabricated as separate diode laser chips that are integrated onto a separate mounting substrate. The high reflection coating 112 on these diode laser chips is a broadband HR that optimizes the reflection of all the diode laser emission wavelengths. The facet of the diode laser gain media that faces the integrated structure 335 is coated with the anti-reflection coatings (AR) 114, 113, and 115 that are optimized to minimize the reflection of radiation at a wavelength corresponding to each diode laser gain media emission wavelength. Similarly, on the input facet of the integrated structure 335, the anti-reflection coatings 322, 323, and 321 are optimized to minimize the reflection of the radiation for the diode laser gain media 110, 111, and 109, respectively. If all the diode laser emission wavelengths are similar, then the AR coating 114, 113, and 115 can be the same coating. Similarly, the AR coatings 322, 323, and 321 can be the same coating for a small variation of diode laser emission wavelengths.

In FIG. 6, the polarization selective wavelength filters 130, 131, and 129 are optimized to operate at the wavelength of the respective diode laser gain media, and the wavelength of the individual diode laser sources can be independently tuned by applying a different set of voltages to the leads 134 and 135. It should be noted that the filters 130, 131, and 129 could be a combined transverse and longitudinal mode filter. These mode filters work in combination with the polarized waveguides 140, 141, 139, the high reflectors 112, the feed back reflectors 310, 311, and 309 and the gain mediums 110, 111, and 109 to operate as described above in relationship to FIG. 4 to produce laser operation at a set of fundamental frequencies. The frequency is selected and stabilized by the filters 130, 131, and 129, and the polarization is rotated from TE which is desirable for the amplifier medium to TM which is desirable for the frequency conversion.

The frequency converters 320, 321, and 319 are preferably a quasi-phase matched structure fabricated in TM polarized waveguide segments 140, 141, and 139. As illustrated in FIG. 6, each of the frequency converter sections would have a different period to optimize the frequency conversion process for the specific infrared emission wavelength of the diode laser gain media. The integrated structure 335 is fabricated from z-cut ferroelectric crystalline material such as lithium niobate and the TM polarized waveguide segments 140, 141, and 139 are fabricated using APE.

The RGB laser output from the integrated structure 335 could then be used directly or it could be the input to an integrated optic waveguide structure that could be used in a specific application. Many other array structures can be deduced by those skilled in the art from the structure illustrated by FIG. 6 that would optimize a specific application.

Figure 7:
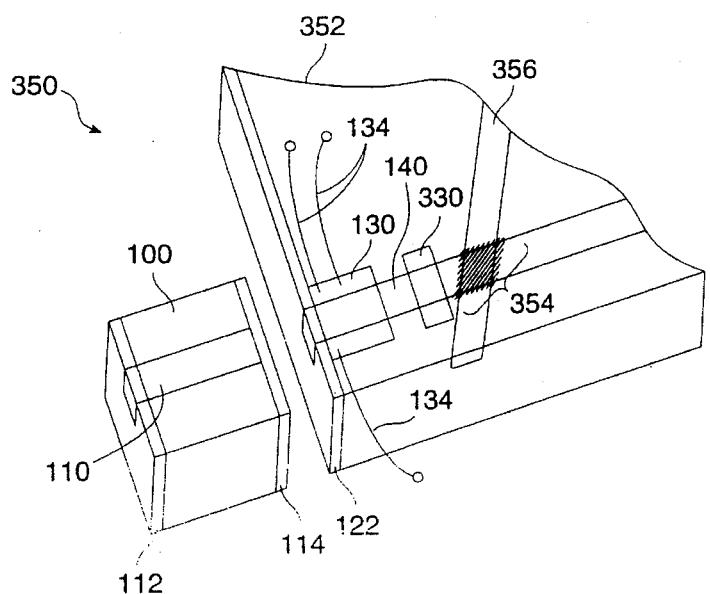
FIG. 7 is a perspective view of a frequency selected external cavity laser structure used to provide a TM polarized beam to an integrated optic waveguide structure.

FIG. 7 illustrates a frequency selected external cavity laser structure 350 used to provide a TM polarized, frequency selected beam for an integrated optic waveguide structure 352. Grating reflector components such as the large angle grating reflector 354 need TM polarization for high efficiency because their Brewster angle is at an angle of incidence of nearly 45°. They also need frequency selectivity because only a specific wavelength will reflect at the design angle, due to the dispersion of the grating. The polarization selective wavelength filter 130 in combination with the polarized waveguide 140, the reflectors 112 and 310 and the gain medium 100, operate as described above to produce laser operation at a fundamental frequency. The frequency is selected and stabilized by the filter 130, and the polarization is rotated from TE which is desirable for the amplifier medium to TM which is desirable for the integrated structure 352. The integrated structure 352 is preferably fabricated from z-cut ferroelectric crystalline material such as lithium niobate, in which case the TM polarized waveguide segment 140 may be fabricated using APE.

As a variation on the structure of FIG. 7, the integrated optic waveguide structure 352 may contain one or more additional frequency selected external cavity laser structure, operating at different selected frequencies. The beams resulting from two or more of these sources may be combined into a single waveguide using beam combining technology known in the art such as parallel waveguide directional couplers or such as a grating waveguide coupler. If the grating waveguide coupler is used, the angle of the grating must be adjusted to optimally couple the input radiation to propagate in the desired direction in the waveguide. Frequency mixing may be accomplished after two beams are combined, using a periodically poled nonlinear structure such as is described above. The mixing process may either be sum frequency mixing or difference frequency mixing, according to the application. In another application, two or more different laser frequencies may be selected in this way, followed by combining and frequency doubling steps to produce two or more visible colors directed to a pixel of a display. If an upconversion phosphor is used to create visible light for the display, multiple invisible frequency beams may be controlled and combined in this way to produce controllable color at the pixel.

Figure 8:
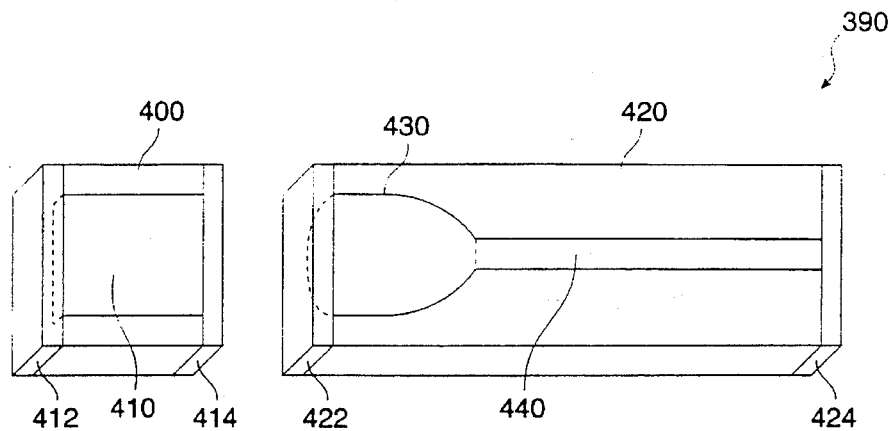
FIG. 8 is a top perspective view of a transverse-mode-selected external cavity laser structure.

FIG. 8 shows a transverse-mode-selected external cavity laser structure 390 with mode conversion means 430 to produce single transverse mode operation. A resonant cavity is formed between the reflectors 412 and 424, with a laser exciter 400 and an integrated optical mode filter structure 420 aligned on the optical path within the optical cavity defined by the reflectors 412 and 424. Reflector 424 is also the means for extracting optical energy from the laser resonator. The laser exciter 400, in the preferred embodiment, is a multimode element or multimode laser exciter, defined as a laser amplifying medium with a transverse dimension 410 wide enough to support multiple transverse modes. The amplifying medium is limited to a maximum optical (and electrical excitation) power density, as are the optics 412, 414 and 422. The wide-beam configuration permits the extraction of higher optical power from the exciter. However, there is no constraint on the transverse optical phase in a conventional wide beam structure so that the optical power emerges from the wide stripe in a combination of higher order transverse modes. Only a tiny fraction of the power then resides in the lowest order transverse mode.

A device according to this invention extracts a large portion of the wide stripe exciter power into a single transverse mode. It does this in part by means of antireflection coatings 414 and 422 between the exciter structure and the mode filter structure 420 to suppress independent oscillation of the exciter. Oscillation occurs between the reflectors 424 and 412, which may be metallic reflector or multilayer coatings, dichroic reflectors, grating reflectors, or other optical feedback generating structures. Since the optical cavity contains the single transverse mode waveguide 440, oscillation occurs only on the transverse mode of this waveguide (as it may be transported through the rest of the optical structure). The tapered mode conversion means is optimally designed to couple power between the waveguide mode on one side and the lowest order transverse mode of the exciter on the other. It does so by converting an input phase front characteristic of a mode of one structure, into an output phase front close to the phase front characteristic of the other structure. Light propagating in the waveguide 440, after passing through the mode converter 430, is converted into the lowest order mode of the exciter. This beam is injected into the exciter 400 and is amplified (and possibly phase shifted) as it crosses the exciter and returns. The return mode will also be primarily in the fundamental mode of the exciter structure, except for mode conversion processes, which should be minimized in the design of the amplifier. During the amplification process, the mode will also be distorted by any position dependent phase shifts and by amplified spontaneous emission. However, the light power will reside dominantly in the lowest order transverse mode. This power is coupled back by the mode converter 430 into the mode of the waveguide. The light in the other modes is rejected from the cavity at the waveguide where higher order modes are not guided and diffract into the substrate.

In the preferred embodiment, the laser exciter is a semiconductor diode laser amplifier structure, that is, a current-injected semiconductor structure capable of emitting and amplifying light when excited. Alternatives include other types of laser structure including diode pumped solid state architectures, but the semiconductor diode laser amplifier structure offers the highest efficiency and the lowest cost.

The output facet of the diode laser gain region is coated with an anti-reflection (AR) coating 414 and is butt-coupled to the mode filter structure 420. Embedded in the mode filter structure 420 is a mode reshaper 430, also called the mode reshaping means, which is preferably in the form of an adiabatic tapered horn waveguide region having at one end a broad nozzle, called the first port, acting as an interface with the output AR coated facet 414 of the diode laser gain media, also called the matching multimode port of the multimode laser exciter, and at the other end a narrow neck, called the second port, matched to the single mode waveguide 440. The matching is accomplished by fabricating the size and index profile of the mode reshaper 430 and the connecting elements (in this case the exciter 400 and the waveguide 440) so that the lowest order transverse mode of the connecting elements have essentially the same mode profile as the lowest order mode of the mode reshaper at the interface with the connecting elements. Alignment is assumed so that the modes which propagate on the two sides of the connection are aligned coaxially. The connecting elements are aligned longitudinally so that coupling is accomplished within a Rayleigh range or so to minimize losses due to diffraction.

The design constraints and fabrication techniques for this adiabatic tapered waveguide structure have been previously described in the art. In particular, the local adiabatic taper angle should always be less than the local divergence of the mode. This means that the taper may be quite fast when the waveguide is small, but the taper must be weak for large waveguides. In this device, a broad area multimode laser source can be used to produce a single mode output, thereby substantially enhancing the output power over that of a single-transverse mode diode laser that has a width of the gain region that is typically 3 microns. Since the waveguide segment 440 supports only a single transverse optical mode, all other possible spatial modes that are supported by the wide multi-mode gain region 410 have significant loss and will not reach lasing threshold in a properly designed system. Increasing the length of the waveguide 440 can increase the discrimination against the higher order modes, and reducing the excitation of the amplifier section can reduce the power generated in the higher order modes (it is particularly important to operate below the onset of filamentation in the amplifier). Thus the use of the multi-transverse mode gain media enables output powers that are much larger than those obtainable from single transverse mode gain media. This is important in applications where a diffraction limited spatial beam profile is a major concern.

The mode filter structure 420 is preferably fabricated from a lithium niobate substrate. Tapered waveguides may be fabricated in any cut. Use of lithium niobate, a nonlinear electro-optic material, allows integration of other devices with the waveguide 440, including electro-optic modulators, mode converters, switches, couplers, and/or nonlinear optical frequency converters, etc. Other possible substrate materials include other ferroelectric crystalline materials (such as lithium tantalate or KTP), other crystalline materials such as silicon, any type of glassy or amorphous material (such as BK-7, soda lime glass, or fused silica), and thin films of materials such as $SiO_2$ on silicon, lithium niobate on itself, and any others capable of supporting patterned waveguides. The tapered structure may also be integrated into the semiconductor wafer material that is used to fabricate the laser diode. The constraint is that the single mode portion of the waveguide and the input and output surfaces must be capable of supporting the entire circulating power without damage.

In the preferred embodiment, the waveguides are fabricated in z-cut $LiNbO_3$ from Ti or Zn indiffusion, or annealed proton exchange, depending on the wavelength and polarization properties of the diode laser gain medium. For example, if an APE process is used to fabricate the waveguides on z-cut LiNbO$_3$, a TM polarized waveguide is produced. Alternately, if the waveguides were fabricated using Ti or Zn indiffusion, either TE or TM polarized modes are supported.

Alternate waveguide and substrate material combinations can also be used to fabricate the previously described frequency selective and mode filter structures. For example, the waveguides do not necessarily need to be fabricated in the substrate material. Alternately, thin film of a different material could be deposited on top of a substrate material to form the waveguide. For the structures described by the frequency selective filter 130 in FIG. 1, either the substrate or the waveguide can be fabricated from an electro-optically active material. Since the mode filter structure 420 in FIG. 8 is a passive structure, the only requirement on the fabrication materials is that a suitable waveguide structure be fabricated on a substrate material that can be integrated with the diode laser gain media. Examples of alternate combinations of waveguides and substrate materials include As$_2$S$_3$, SiO$_2$, or Si$_3$N$_4$ thin film waveguide structures fabricated on Si or glass substrates, indiffused or ion exchanged waveguides on Si or glass substrates, and spun-on or dipped polymer (E-O active or passive) waveguides on Si or glass substrates. Single or multi-layer waveguide structures can be designed to meet specific application requirements. The waveguide may be fabricated as a passive structure, or it could be fabricated from a nonlinear material optical that is also electro-optically active. Many other combinations of waveguides and substrates would be apparent to those skilled in the art.

Several variations on the basic structure of the intracavity mode filter can be envisioned. For instance, the mode filter may be a composite element as described in reference to FIG. 9, to allow wider gain media. Alternatively, the waveguide 440 may be a multimode waveguide with a different dimension than the gain media, in order to optimize the coupling of the high power of the wide gain medium to multimode waveguides. In the case of a multimode waveguide 440, the laser oscillator will operate on multiple transverse modes, but these modes will be optimally coupled to the waveguide 440. Such optimal coupling is important for high power applications involving waveguide devices. Of course, the mode filter structure 420 may be only a part of an integrated device containing other functional components. If the structure 420 is integrated with other devices, the reflector 424 may not be a coated edge surface as shown in FIG. 8. It may be one of a number of structures, including a grating reflector, a deep groove in the substrate with vertical faces, or any other structure with sufficient reflectivity to produce oscillation of the gain medium 400. Of course, isolating structures may be used either in bulk or integrated form to prevent spurious reflections from altering the performance of the external cavity laser. Isolation of some kind should be used if the feedback from other structures is large enough to produce an undesired modification of the laser operation.

As the width of the multi-mode gain medium expands beyond 50–100 microns, the length of the tapered adiabatic horn 430 becomes relatively long. This is due to the fact that the rate of taper must be very small, as described above, for wide waveguides. The taper simply becomes ineffective at large waveguide dimensions. However, another geometry, the integrated lens, becomes easier and easier to fabricate as the waveguide dimensions become large. It therefore makes sense to use the integrated lens coupling geometry for large waveguide dimensions, and possibly to combine the lens with the taper. The focussing effect of a given geometry of integrated lens depends on the index change, which depends on the fabrication technique. The index change which can be achieved at present with proton exchange or indiffused waveguides is limited to about 0.001. While this is sufficient for some applications, other techniques which provide a larger index change may be used to form the lens. These techniques include both deposition of a patterned high index film on top of the planar waveguide, etching away of some of the waveguide material in a patterned form, and irradiating portions of a crystalline substrate to disrupt the crystalline pattern, thereby changing the indices of refraction.

If, for example, an 0.25 micron layer of a high index film such as TiO$_2$ is patterned on top of a single mode waveguide, the change in index of refraction is about 0.01, or ten times larger than that of the waveguide itself relative to the bulk. The addition of the high index film may have a large effect because it tends to draw the mode into the high index region. The addition of a low index film has a much lower effect because the low index film tends to expel the mode. If a high index material is uniformly laid down over the substrate and removed outside the boundary of the lens, a positive index change is obtained within the lens. Of course, the removal process should be selected from among those known in the art which do not significantly etch away the substrate, or undesired losses may be created. If the high index material is removed within the boundary of the lens, a negative index change is obtained within the lens. If the change in index is positive (negative), the shape of a focussing lens is convex (concave).

Figure 9:
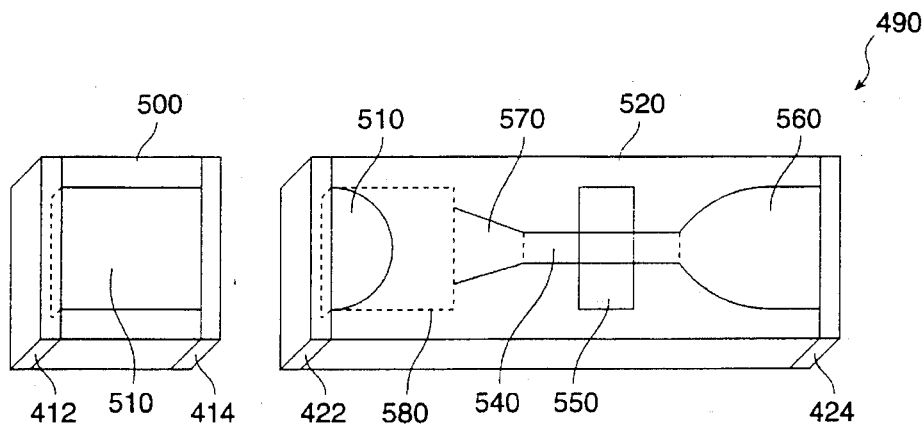
FIG. 9 is a top perspective view of a transverse-mode-selected external cavity laser structure which includes a convex integrated lens and a second tapered horn region.

FIG. 9 illustrates a transverse-mode-selected external cavity laser structure 490 with mode conversion means 580 which include both a tapered horn region 570 and a convex integrated lens 510 within a planar waveguide 540. In this embodiment, a wide diode laser gain region 510 is butt coupled to the mode filter structure 520. Several different methods for fabricating this lens have been discussed in the prior art and are summarized in H. Nishihara et al., Optical Integrated Circuits, (McGraw-Hill, New York, 1985). The lens 510 is shown as a convex, or concentrating, lens which is appropriate for an increased index of refraction as described above. If the lens is fabricated by a process which lowers the index of refraction within the lens structure, a concave lens geometry (not shown) is used, as is known in the art. As a further variation, multiple consecutive lenses may be used to increase the concentration of the light beam within a given distance.

The lens 510 is embedded in a planar waveguide 580 that extends at least from the AR coated input facet 422 of the mode filter structure to the beginning of an optional tapered horn region 570. If no tapered horn 570 is present, the planar waveguide 680 extends at least to the input end of the waveguide 540. Light from the diode gain medium is butt coupled into the planar waveguide which maintains collimation of the mode in the direction normal to the surface of the mode filter structure 520. The light propagating in the planar waveguide is phase shifted by the integrated lens 510 so as to produce a concave, converging phase front (in the horizontal plane) after traversing the lens. As it continues to propagate, the light beam continues to concentrate spatially or focus down until it is coupled into the adiabatic tapered horn waveguide section 570. The coupling is preferably done in the focal region of the beam where the phase fronts are approximately planar. As before, to optimize the coupling between the focussed mode propagating in the planar waveguide and the mode of the two-dimensional waveguide, the two modes are aligned coaxially, and the guiding structures are fabricated to produce approximately equal mode profiles. Thus the length of the coupling region between the exciter 500 and the waveguide 540 can be significantly reduced for wide gain media, compared with that of the embodiment without the lens illustrated in FIG. 9. The lens and planar waveguide can be fabricated using methods known in the art, preferably using an APE process to fabricate both the planar waveguide and the integrated lens. The proton concentration can be adjusted to produce a higher index within the lens region than in the rest of the planar waveguide. The light then propagates in the single mode waveguide segment 540 and reflects from the feedback reflector 424 to form a resonant single mode cavity in a manner similar to that discussed above for FIG. 8.

Also shown in FIG. 9 are optional structures 550 and 560 that may be integrated in the mode filter structure 520. Structure 550 is preferably an optional integrated grating feedback reflector that would stabilize the wavelength of the extended diode laser cavity. This grating feedback reflector is similar to that discussed above, and if used, replaces the function of the reflector 424. It may be more useful to have a planar reflecting structure in the case where the filter structure 520 is a portion of a larger integrated optic structure. The grating reflector also provides frequency selectivity, which is an advantage in many applications. If the grating feedback reflector 550 is used in the design of the device 490, the coating 424 would optimally become an anti-reflection coating. Structure 560 is an optional second adiabatic horn or tapered waveguide section, on the output end of the single mode filter structure 520, that is a means for expanding the optical mode structure at an output location. It can be used to reduce the output power on the surface incorporating the mirror 424. The surface of an optical element is frequently more sensitive to optical damage than the bulk. Of course, the single mode waveguide 540 must stand the concentrated power flowing through it without damage. If a later structure such as an integrated device or a polished edge of the structure 520 is more sensitive to optical damage, it will be useful to incorporate the tapered horn structure 560 prior to that structure to reduce the optical intensity at that sensitive element below its damage threshold.

In an alternative embodiment of FIG. 9, the structure 550 is a quasi-phase-matched frequency converter structure similar to that described above in reference to FIGS. 4 and 5. The transverse mode filter structure which produces single transverse mode operation is particularly useful in this configuration. The conversion efficiency increases with the incident power concentrated within the acceptance frequency of the doubler. With the use of the transverse mode filter, a greatly increased (compared to the single stripe, single transverse mode exciter) amount of optical power can be extracted from the exciter and delivered to the doubler within its acceptance bandwidth. This increases both the efficiency of the frequency conversion and its output power.

As a further alternative embodiment, the structure 550 may contain both a quasi-phase-matched frequency converter and an integrated optical feedback structure such as a grating. If the grating is configured as a retroreflector for the fundamental frequency produced by the exciter, it acts as the end mirror for the resonator, and mirror 424 is replaced either by an AR coating or the interface on which the mirror 424 is fabricated may be removed entirely (in the case of a continued integrated device). The grating may be disposed either before or after the frequency converter, according to the desired optimization of the device. If the grating retroreflector is disposed prior to the frequency converter, for instance, the fundamental intensity in the converter will be reduced. This will not be a problem if the power level is high enough. However, if the power level is low enough so that it is difficult to obtain the desired conversion efficiency, for example, it might be better to place the grating retroreflector after the frequency converter, placing the frequency converter element intracavity.

In another alternative embodiment, the structure 550 may be a wavelength selective polarization converter such as element 130 described in reference to FIGS. 1 through 6. The polarization converter will be controlled by voltages applied through leads similar to leads 134 as described in reference to FIGS. 1 through 6. This embodiment of the structure of FIG. 9 incorporates both transverse mode control via the mode filter structure and longitudinal mode control via the wavelength selective polarization converter. Additional elements may also be integrated into the substrate of the mode filter structure 520.

Figure 10:
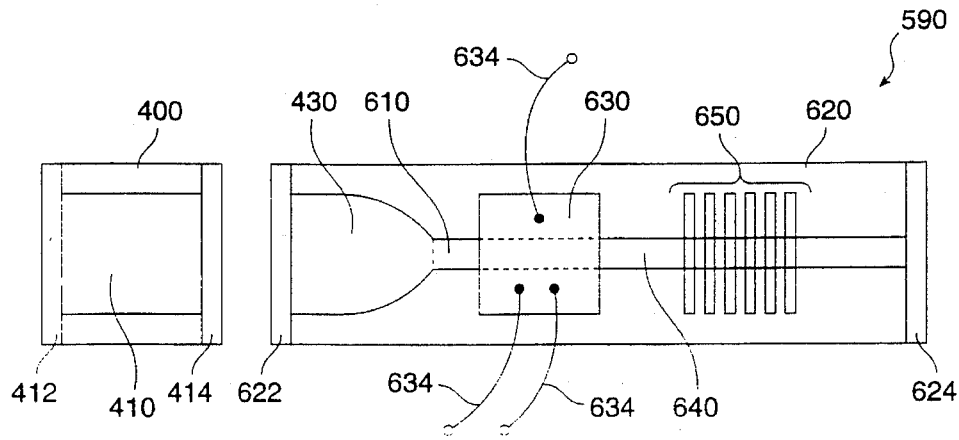
FIG. 10 is a tope diagrammatic view of a mode-selected frequency doubled external cavity laser source which includes control of both transverse and longitudinal modes.

FIG. 10 shows a mode-selected frequency doubled external cavity laser source 590 which includes control of both transverse and longitudinal modes. The mode conversion means 430 produces single transverse mode operation, the wavelength selective polarization converter 630 produces single longitudinal mode operation, and the frequency converter structure 650 produces frequency converted output light. In this embodiment an electro-optically tuned wavelength selective filter 630, similar to that discussed above in relation to FIG. 1, is integrated into the mode filter structure 620. In the resulting structure, both the transverse and the longitudinal modes of the exciter are externally controlled. The TE-TM wavelength selective filter 630 operated intracavity with a TE polarized exciter and a TM polarized waveguide 640 selects only a single wavelength for oscillation. The tapered adiabatic horn 430 and the input waveguide segment 610 must be fabricated to support the propagation of the TE polarization mode. Preferably these waveguide segments would be fabricated using Ti or Zn indiffusion. The electro-optically tuned wavelength selective filter 620 converts the polarization of the light from TE to TM. In addition, it makes possible the use of the high gain TE mode in the exciter, and the preferable TM mode in a z-cut lithium niobate periodically poled frequency converter. The transverse mode filter 430 both allows the use of a high power exciter, and concentrates a large fraction of its power into a single transverse mode, suppressing the other modes.

The frequency converted radiation is transmitted by the feedback reflector 624 (which could be a dichroic coating structure or a Bragg grating) while the unconverted optical radiation at the fundamental wavelength is reflected and propagates back down the waveguide segment 640 toward the diode laser gain medium 410 to complete the resonating cavity. Alternate configurations such as those discussed in reference to FIGS. 4 and 5 could also be integrated with the mode filter structure described here.

The frequency converter 650 may be a frequency doubler, which may be configured to generate visible light for applications such a data storage and display. It may also be a parametric amplifier for generating a pair of frequencies whose frequencies add to that of the fundamental. Or, it could be a frequency mixer tuned to generate the sum or the difference frequency of two different input frequencies.

It is noted here that all of the structures described in connection with FIGS. 1–10 can be operated in an amplifier configuration by removing either of the end coatings of the resonator structure. For example, in FIG. 1, the removal of either coating 124 or coating 112 would give a device that would be a wavelength selective amplifier. This amplifier can be operated in either a single pass or a double pass configuration, depending on the specific application requirements.

The invention has now been explained with reference to specific embodiments. Other embodiments will be apparent to those of ordinary skill in the art. Therefore, it is not intended that the invention be limited, except as indicated by the appended claims, which form a part of this invention description.

We claim:

1. An optical source comprising:
   a first optical reflector;
   at least a second optical reflector aligned with said first optical reflector to define a resonating structure;
   an optically active medium means for supporting multiple transverse modes, said optically active medium means disposed in said resonating structure;
   an integrated optical mode filter structure in an optical path within said resonating structure, the integrated optical mode filter structure comprising:
   mode reshaping means for reshaping said transverse modes, said mode reshaping means having a first port and a second port, said first port coupled to a matching multimode port of said optically active medium means; and
   a waveguide means, said waveguide means coupled to said second port, said waveguide means for supporting a different mode structure than mode structure of said multimode laser exciter; and
   means for extracting coherent optical energy from the optical path passing through said mode reshaping means.

2. The apparatus according to claim 1, wherein said waveguide supports only a single optical mode.

3. The apparatus according to claim 2, wherein said mode reshaping means comprises a tapered waveguide segment having an adiabatic taper.

4. The apparatus according to claim 3, wherein said mode reshaping means further comprises a concentrating lens coupled between said tapered waveguide segment and said optically active medium means.

5. The apparatus according to claim 1, wherein said mode reshaping means comprises a concentrating lens coupled between said waveguide and said optically active medium means.

6. The apparatus according to claim 1, further including optical frequency conversion means in said optical path for converting a fundamental frequency signal to a harmonic of said fundamental frequency signal.

7. The apparatus according to claim 6, wherein said optical frequency conversion means is a quasi-phase-matched frequency converter.

8. The apparatus according to claim 6, wherein said optical frequency conversion means is disposed within said resonating structure.

9. The apparatus according to claim 1, further including optical frequency conversion means in said optical path for generating first and second output signals from a fundamental frequency signal, said first and second output signals being of first and second optical frequencies, the sum of said first and second frequencies being equal to said fundamental frequency.

10. The apparatus according to claim 1, further including optical frequency conversion means in said optical path for generating an output signal from a fundamental frequency signal of said laser element and a second input signal at a second frequency, the frequency of said output signal being a linear combination of said fundamental frequency and said second frequencies.

11. The apparatus according to claim 1, wherein said integrated optical mode filter structure further includes a locally-periodic frequency selection structure.

12. The apparatus according to claim 11, wherein said frequency selection structure comprises a Bragg grating reflector.

13. The apparatus according to claim 11, wherein said frequency selection structure comprises an electrically-controlled poled structure grating reflector.

14. The apparatus according to claim 1, further including means for expanding optical mode structure at an output location of said waveguide.

15. The apparatus according to claim 1, wherein said integrated optical mode filter structure further includes frequency selection means, said frequency selection means comprising a frequency-selective polarization converter.

16. The apparatus according to claim 1, further including antireflective means disposed between said optically active medium means and said integrated optical mode filter structure.

17. An optical source comprising:
   an array of first optical reflectors;
   an array of second optical reflectors aligned with corresponding ones of said first optical reflectors to define an array of resonating structures;
   an array of multimode laser exciters disposed in each one of said resonating structures;
   an array of integrated optical mode filter structures in optical paths defined by said resonating structures, the integrated optical mode filter structures each comprising:
   mode reshaping means having a first port and a second port, said first port coupled to a matching multimode port of a corresponding said multimode laser exciter; and
   a waveguide means, said waveguide means coupled to said second port, said waveguide means for supporting a different mode structure than mode structure of said corresponding optically active medium means; and
   means for extracting coherent optical energy from each one of said optical paths passing through each one of said mode reshaping means.

18. The optical source according to claim 17 wherein said multimode laser exciters are operative at a plurality of different fundamental wavelengths.

19. The optical source according to claim 18 further including a plurality of quasi-phase-matched optical frequency conversion means, each of which is disposed in one of said optical paths for converting the fundamental frequency of a said corresponding exciter to its harmonic frequency, and wherein periodicity of each said conversion means is fabricated to produce phase matching of frequency conversion of the fundamental frequency of its corresponding exciter.

20. A mode-filtered optical source comprising:
   a multimode laser amplifier disposed in an optical path; and
   an integrated optical mode filter structure in said optical path, the integrated optical mode filter structure comprising:

mode reshaping means having a first port and a second port, said first port coupled to a matching multimode port of said multimode laser amplifier; and a waveguide means, said waveguide coupled to said second port, said waveguide means for supporting a different mode structure than mode structure of said multimode laser amplifier.

21. A frequency-converted diode laser source comprising:

a wide-stripe multimode laser diode element;

a ferroelectric harmonic generator having a waveguide for receiving light of a first frequency at an input end from said wide-stripe multimode laser diode element and emitting light of a second frequency at an output end thereof, said second frequency of light being a harmonic of said first frequency of light, and ferroelectric harmonic generator generating said light of said second frequency from said light of said first frequency;

integrated mode reshaping means having a first port and a second port, said first port coupled to a matching multimode port of said multimode laser diode element, wherein said waveguide means is coupled to said second port, said waveguide means supporting a different mode structure than mode structure of said multimode laser diode element;

said ferroelectric-harmonic generator also having a periodic reflector positioned along said waveguide and tuned to partially reflect light of said first frequency back toward and out of said input end;

said laser diode element being optically coupled via said integrated mode reshaping means to said waveguide means of said ferroelectric harmonic generator;

said laser diode element including active gain means for generating light of said first frequency, second cavity reflector associated with a back facet of said laser diode and a low reflection coated light emitting front facet through which light of said first frequency generated by said active gain means is directed toward said ferroelectric-harmonic generator;

said periodic reflector in said ferrelectric-harmonic generator and said second cavity reflector associated with said back facet of said laser diode element establishing a resonant optical cavity for light of said first frequency such that feedback provided by said periodic reflector stabilizes the laser output to obtain efficient frequency conversion.

22. A single-mode laser comprising within an optical cavity:

an optical gain medium means for serving as a source of a multimode laser signal;

a single-mode waveguide means for filtering said laser signal to a single transverse mode with minimal loss at a fundamental transverse mode, said waveguide means comprising an enhanced refractive index material region, said material region having a spatial dimension and refractive index profile transverse of an optical path supporting only a single transverse mode of a multimode laser signal; and means for coupling said laser signal source to said waveguide means with minimal reflection and minimal loss;

wherein said gain medium means, said coupling means and said waveguide means are disposed between a first primary laser signal reflector and a second primary laser signal reflector.

23. The laser according to claim 22 wherein said coupling means comprises a tapered waveguide.

24. The laser according to claim 23 wherein said tapered waveguide has an adiabatic taper.

25. The laser according to claim 23 wherein said coupling means is butt-coupled to said amplifier.

26. The laser according to claim 25 wherein said coupling means further includes antireflective coatings in the optical path.

27. The laser according to claim 22 wherein said waveguide means is said material region juxtaposed to a solid medium.

28. The laser according to claim 27, wherein said solid medium is an optically nonlinear material.

29. The laser according to claim 27, wherein said solid medium is an electro-optic material.

30. The laser according to claim 29, wherein said material region is an optically nonlinear material.

31. The laser according to claim 29, wherein said material region is an electro-optic material.

32. The laser according to claim 27, wherein said material region is poled.

33. The laser according to claim 27, wherein said solid medium is poled.

34. The laser according to claim 27 wherein said material region comprises a plurality of layers wherein indices of refraction in the waveguide region are greater than the index of refraction of any juxtaposed medium.

35. The laser according to claim 27, wherein said solid medium is silicon.

36. The laser according to claim 27 wherein said material region comprises in-diffused lithium niobate.

37. The laser according to claim 27, wherein said solid medium is lithium niobate.

38. The laser according to claim 27 wherein said material region comprises at least layer of glass over a layer of silicon dioxide on said solid medium, and wherein said solid medium is silicon.

39. The laser according to claim 27, wherein said material region comprises an electro-optic, nonlinear poled material and said solid medium is an electro-optic, nonlinear poled material.

40. The laser according to claim 22 wherein said first primary laser signal reflector is a frequency selective reflector.

41. The laser according to claim 40 wherein said frequency selective reflector is a grating for limiting longitudinal wave modes and which operates as a reflector of said laser signal.

42. The laser according to claim 40 wherein said frequency selective reflector is electronically switchable.

43. The laser according to claim 40 wherein said frequency selective reflector is electronically switchable and further including means for controlling mode locking of laser signal output.

44. The laser according to claim 40 wherein said frequency selective reflector is electronically switchable and further including control means for tuning frequency of laser signal output.

45. The laser according to claim 40 wherein said frequency selective reflector is electronically switchable and further including control means for modulating amplitude of laser signal output.

46. The laser according to claim 40 wherein said frequency selective reflector is electronically switchable and further including control means for modulating frequency of laser signal output.

47. The laser according to claim 22 further including a frequency selective optical element between said first primary laser signal reflector and said second primary laser signal reflector.

48. The laser according to claim 47 wherein said frequency selective optical element is a grating for limiting longitudinal optical modes.

49. The laser according to claim 48 wherein said frequency selective optical element is electronically switchable.

50. The laser according to claim 48 wherein said frequency selective optical element is electronically switchable and further including means for controlling mode locking of laser signal output.

51. The laser according to claim 48 wherein said frequency selective optical element is electronically switchable and further including control means for tuning frequency of laser signal output.

52. The laser according to claim 48 wherein said frequency selective optical element is electronically switchable and further including control means for modulating amplitude of laser signal output.

53. The laser according to claim 48 wherein said frequency selective optical element is electronically switchable and further including control means for modulating frequency of laser signal output.

54. The laser according to claims 22 further including a nonlinear optical converter means in the optical path.

55. The laser according to claims 22 further including a nonlinear optical converter means in the optical path, said converter means comprising a pattern poled structure in a nonlinear optical material.

56. The laser according to claim 55 wherein the pattern poled structure includes means for electro-optic tuning.

* * * * *